(12) United States Patent
Che

(10) Patent No.: US 9,306,183 B2
(45) Date of Patent: Apr. 5, 2016

(54) PHOTOVOLTAIC CONVERSION ELEMENT AND PHOTOVOLTAIC CELL

(71) Applicant: Chi Ming Che, Hong Kong (HK)

(72) Inventor: Chi Ming Che, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 0 days.

(21) Appl. No.: 14/496,175

(22) Filed: Sep. 25, 2014

(65) Prior Publication Data

US 2015/0090337 A1   Apr. 2, 2015

Related U.S. Application Data

(60) Provisional application No. 61/884,461, filed on Sep. 30, 2013.

(51) Int. Cl.
*H01L 51/42* (2006.01)
*H01L 51/00* (2006.01)

(52) U.S. Cl.
CPC ........ *H01L 51/4206* (2013.01); *H01L 51/0091* (2013.01); *H01L 51/4253* (2013.01); *H01L 51/0037* (2013.01); *H01L 51/0043* (2013.01); *H01L 51/0046* (2013.01); *H01L 2251/308* (2013.01)

(58) Field of Classification Search
CPC ...................................... H01L 51/42
See application file for complete search history.

(56) References Cited

PUBLICATIONS

Thomas S. Van Der Poll, et al.; Non-Basic High-Performance Molecules for Solution-Processed Organic Solar Cells; Advanced Materials; 2012; pp. 3646-3649; 24; Wiley-VCH Verlag GmbH & Co. KGaA, Weinheim.
Pankaj Kumar, et al.; Recent Progress and Future Aspects of Organic Solar Cells; Progress in Photovoltaics: Research and Applications; 2012; pp. 377-415; 20; Wiley Online Library.
Yongye Liang, et al.; For the Bright Future—Bulk Heterojunction Polymer Solar Cells with Power Conversion Efficiency of 7.4%; Advanced Materials; 2010; pp. E135-E138; 22; Wiley-VCH Verlag GmbH & Co. KGaA, Weinheim.
Zhicai He, et al.; Enhanced Power-conversion in Polymer Solar Cells Using an Inverted Device Structure; Nature Photonics; Sep. 2012; pp. 591-595; vol. 6; Macmillan Publishers Limited.
Yongsheng Liu, et al.; Solution-Processed Small Molecules Using Different Electron Linkers for High-Performance Solar Cells; Advanced Materials; 2013; pp. 1-6; Wiley-VCH Verlag GmbH & Co. KGaA, Weinheim.
Minlu Zhang, et al.; Bulk Heterojunction Photovoltaic Cells with Low Donor Concentration; Advanced Materials; 2011, pp. 4960-4964; 23; Wiley-VCH Verlag GmbH & Co. KGaA, Weinheim.

*Primary Examiner* — Brian McDowell
(74) *Attorney, Agent, or Firm* — Amin, Turocy & Watson, LLP

(57) ABSTRACT

Described herein are organic photovoltaic (OPV) cells using gold complex(es) with as chemical structure of Structure I as active material:

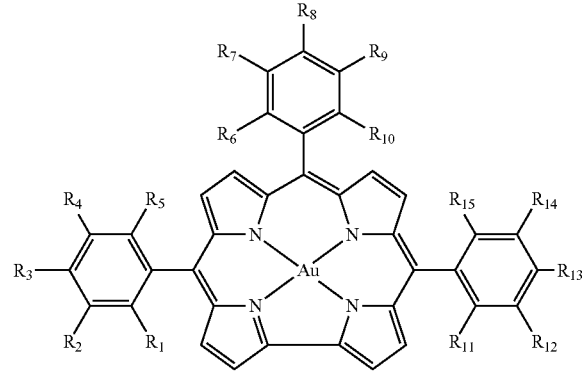

Structure I wherein, wherein $R_1$-$R_{15}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, alkylamino, nitro, acylamino, aralkyl, cyano, carboxyl, thio, styryl, aminocarbonyl, carbamoyl, aryloxycarbonyl, phenoxycarbonyl, hydroxyalkyl, or an alkoxycarbonyl group. The OPV cell can be fabricated by thermal deposition or solution process such as spin coat and printing.

14 Claims, 17 Drawing Sheets

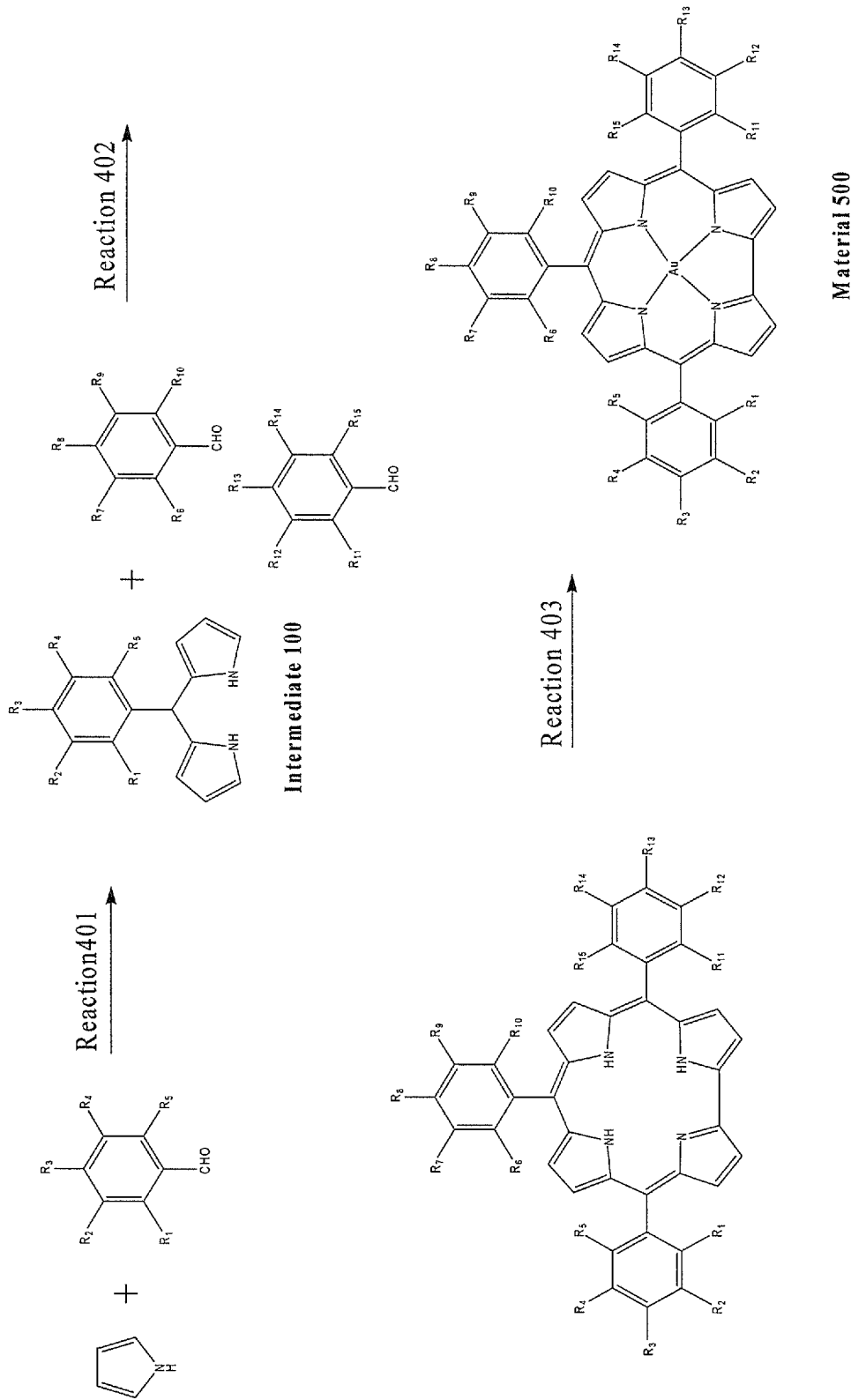
Figure 1: Synthetic Scheme for gold complexes with a chemical structure of Structure I.

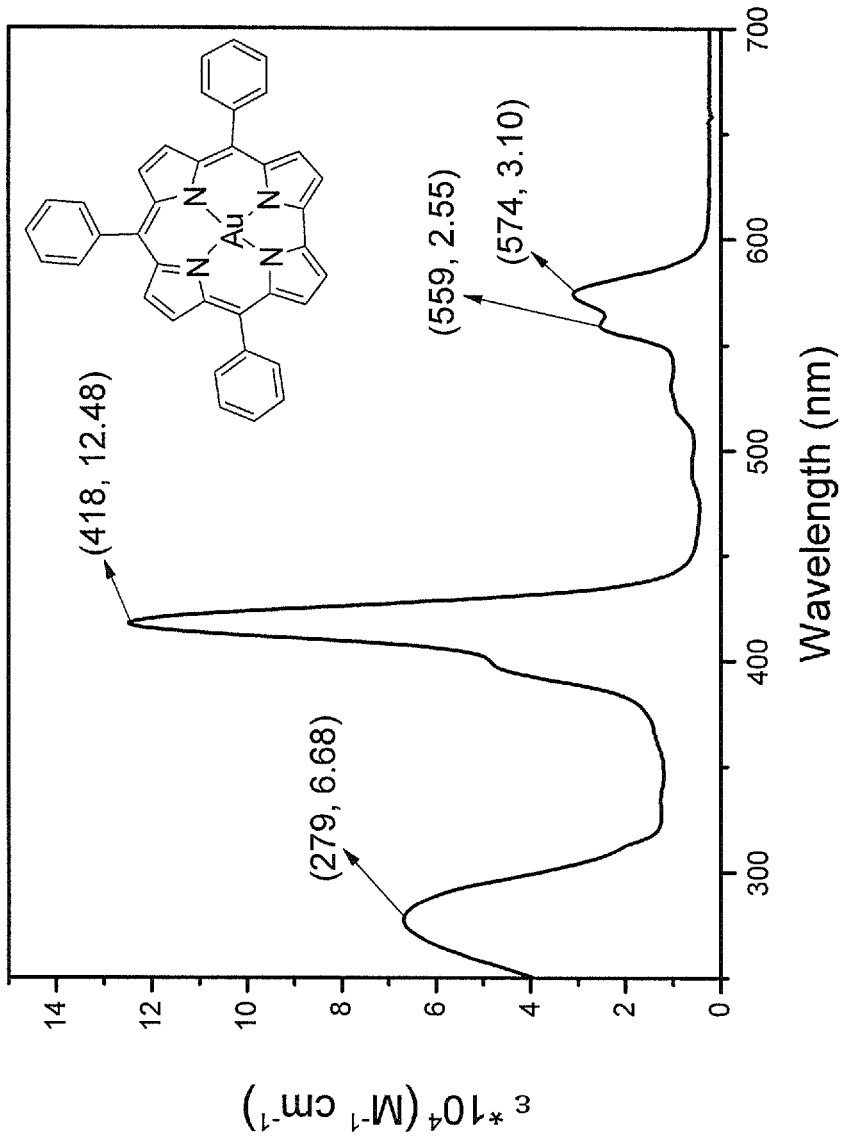
Figure 2: UV spectrum of Material 501 in $CH_2Cl_2$ solution.

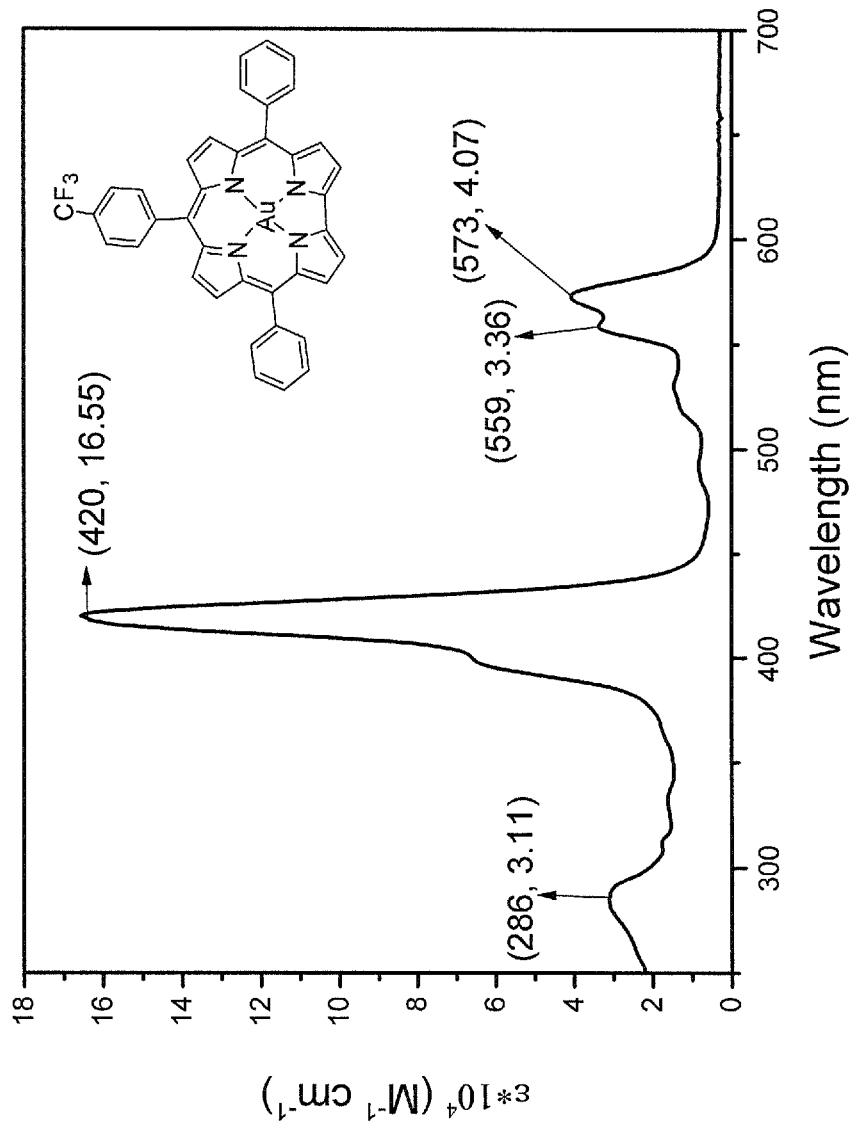
Figure 3: UV spectrum of Material 502 $CH_2Cl_2$ solution.

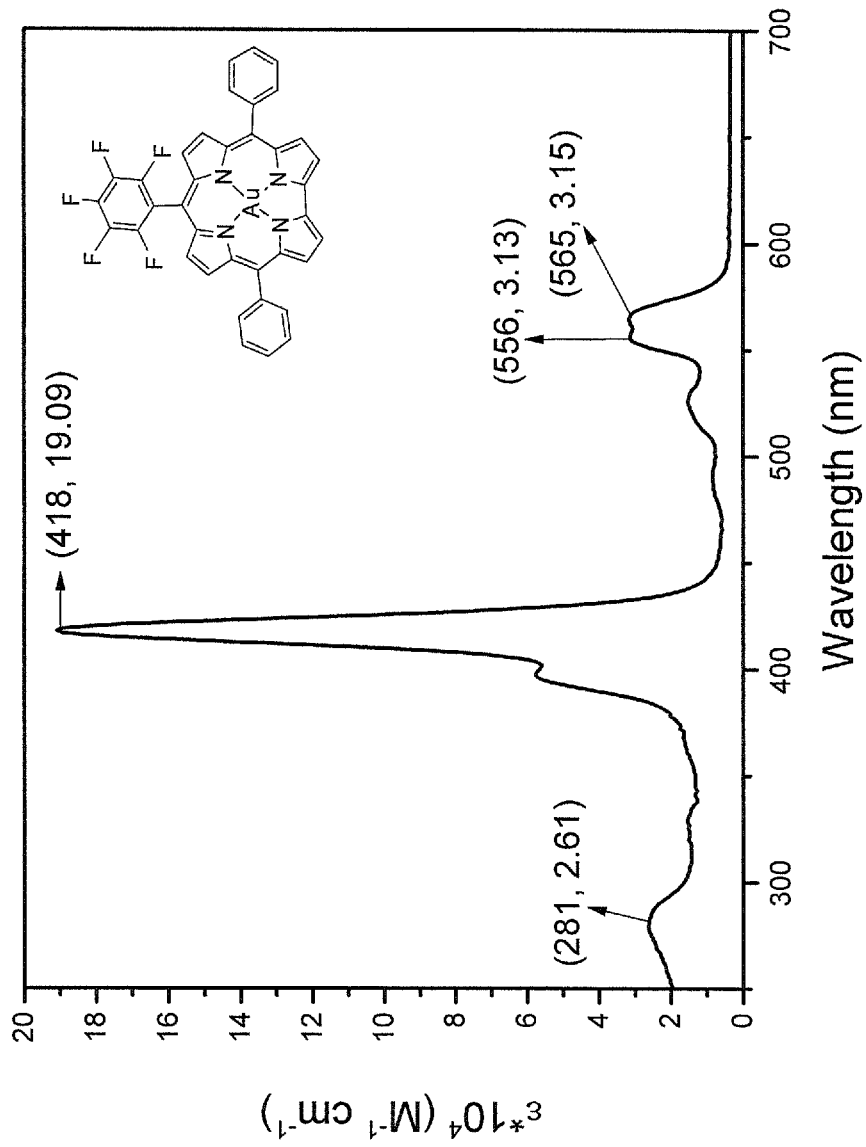
Figure 4: UV spectrum of Material 503 CH$_2$Cl$_2$ solution.

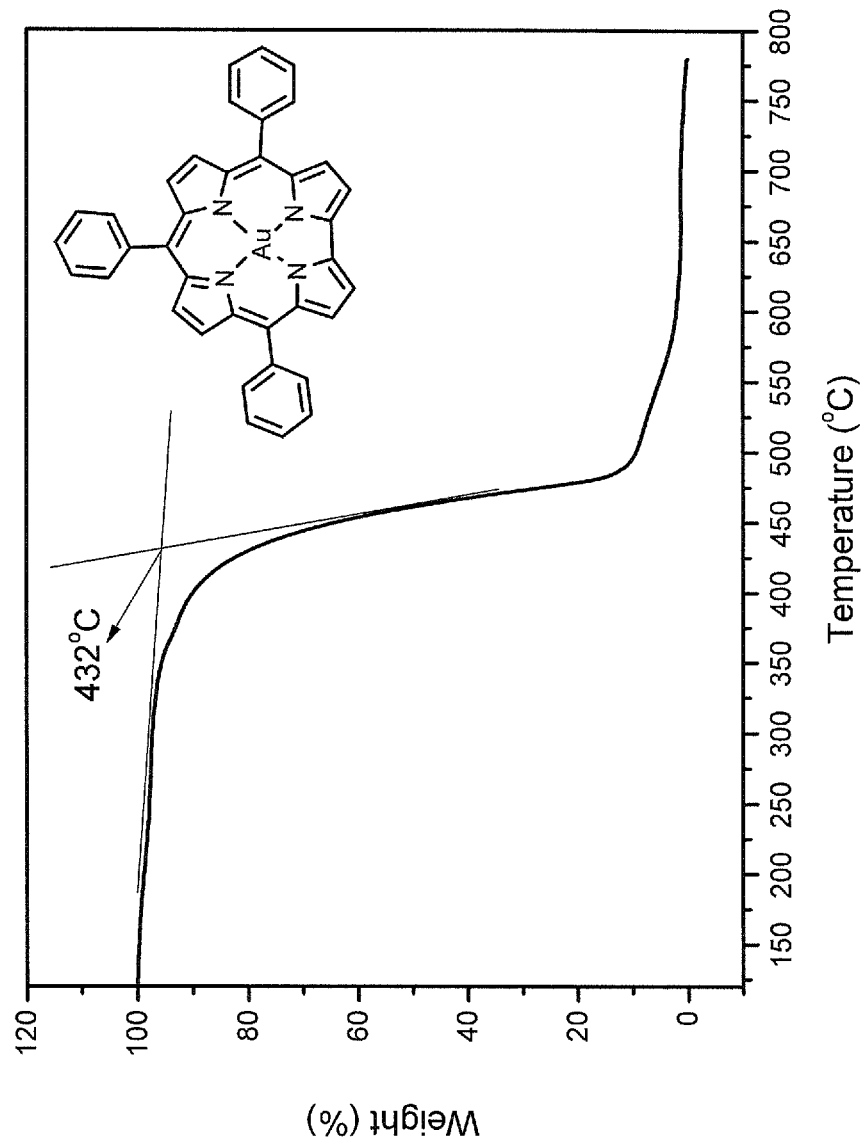
Figure 5: TGA result of Material 501.

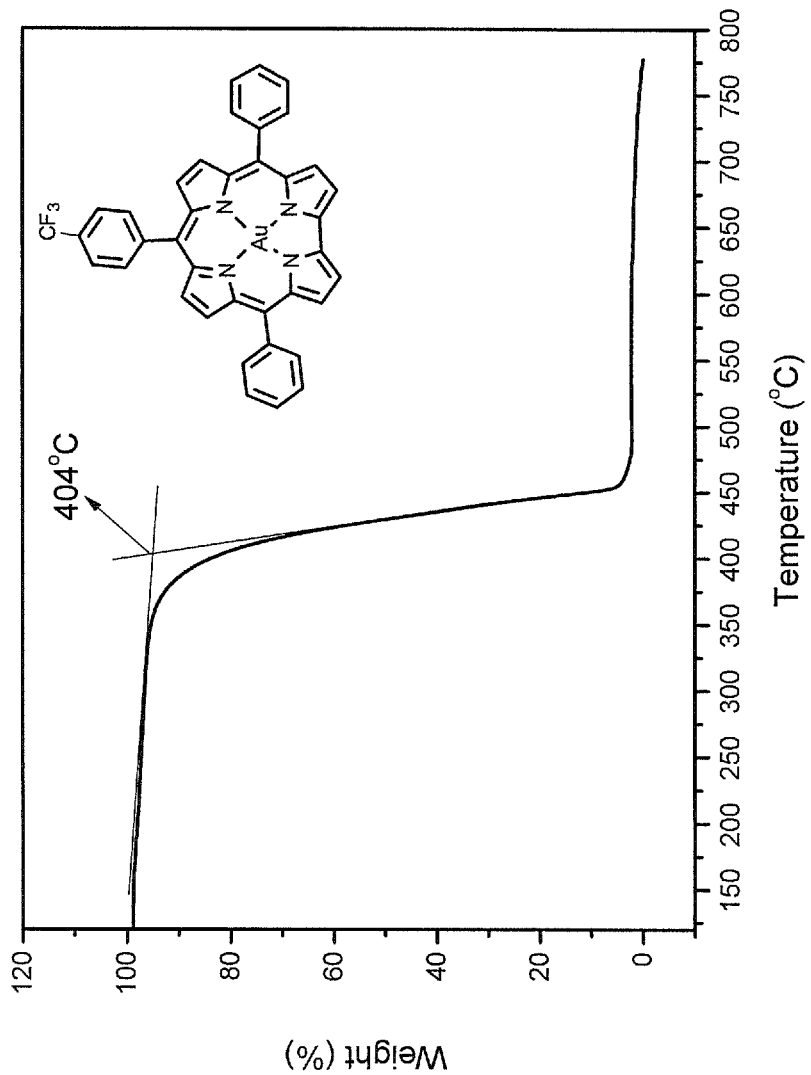
Figure 6: TGA result of Material 502.

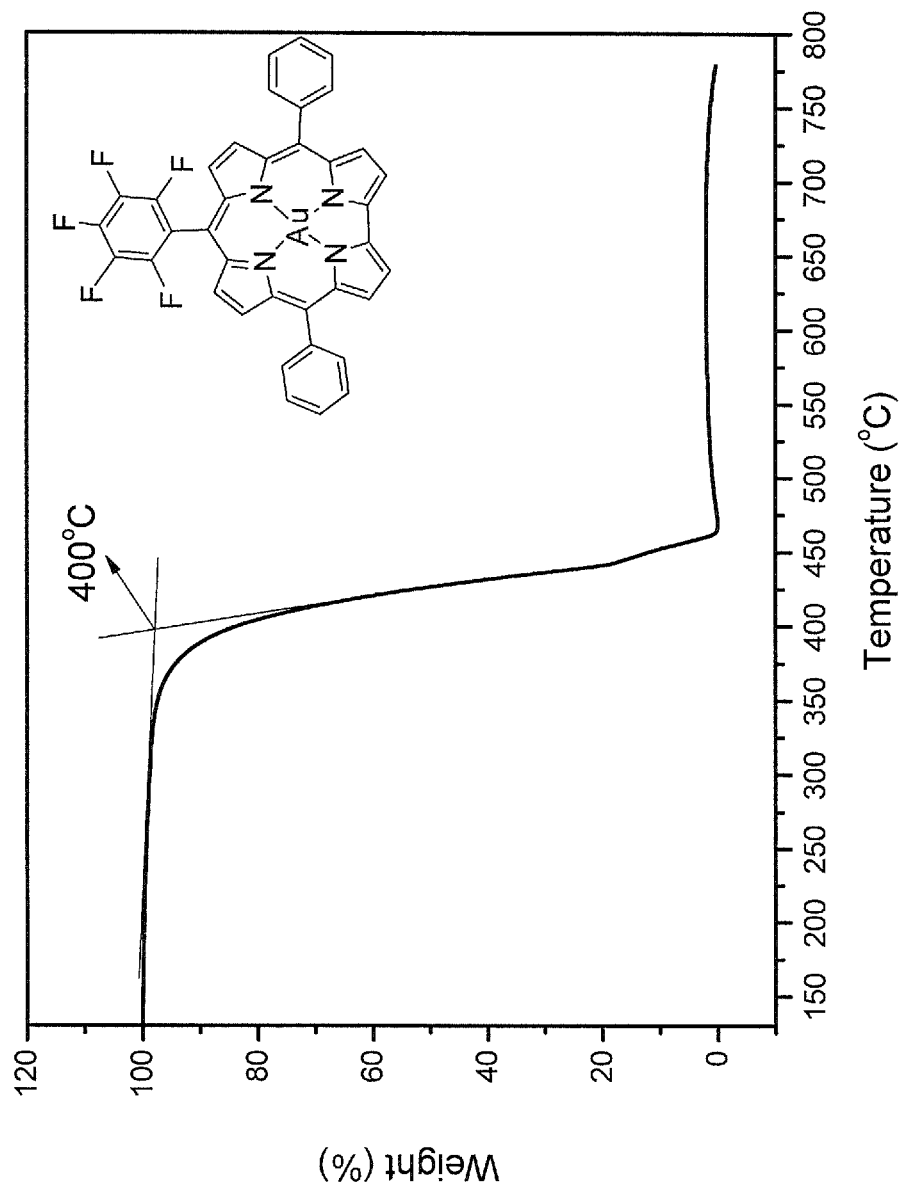
Figure 7: TGA result of Material 503.

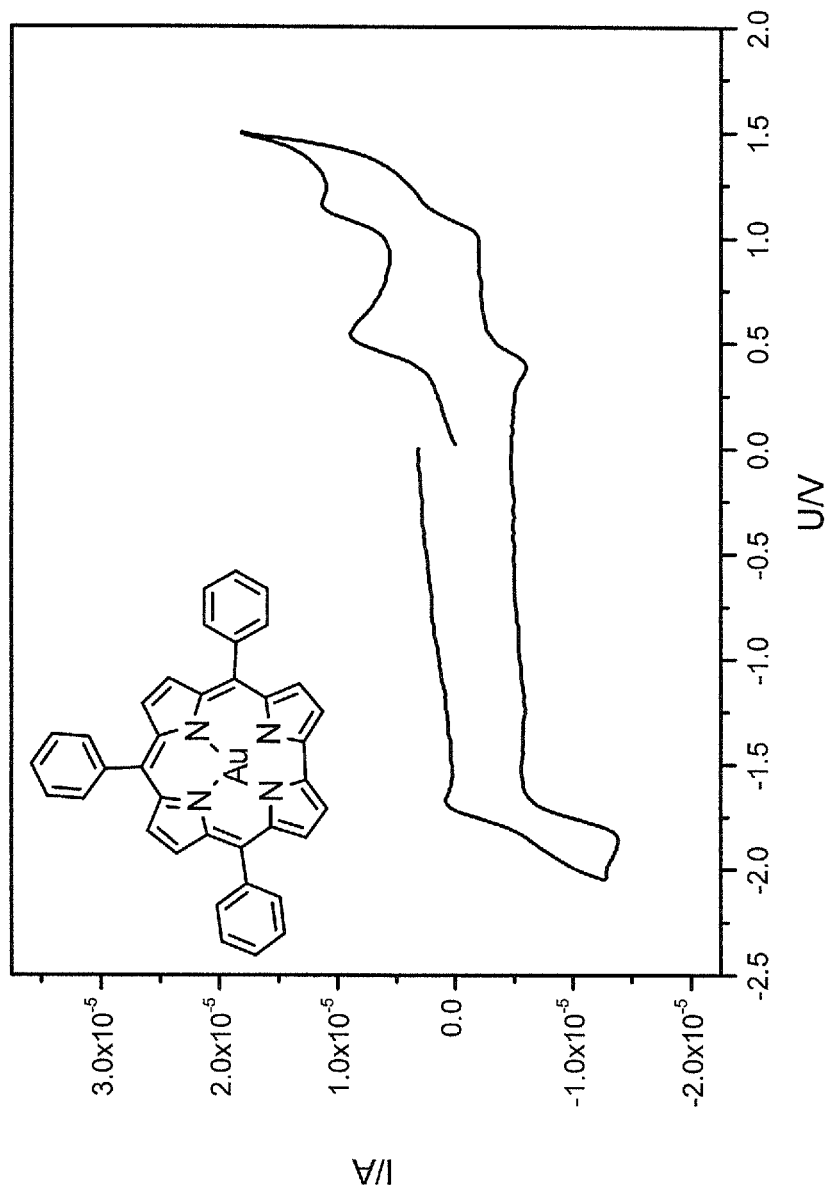
Figure 8: CV result of Material 501.

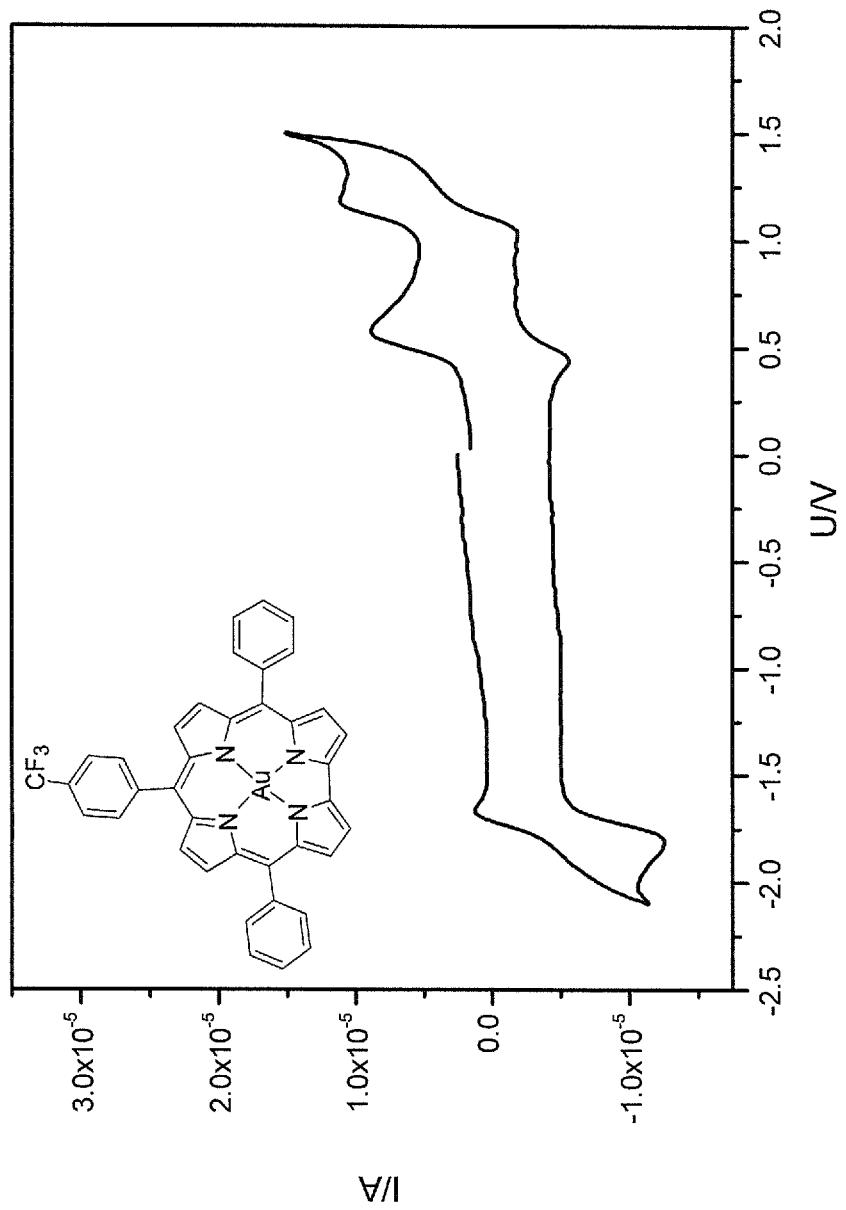
Figure 9: CV result of Material 502.

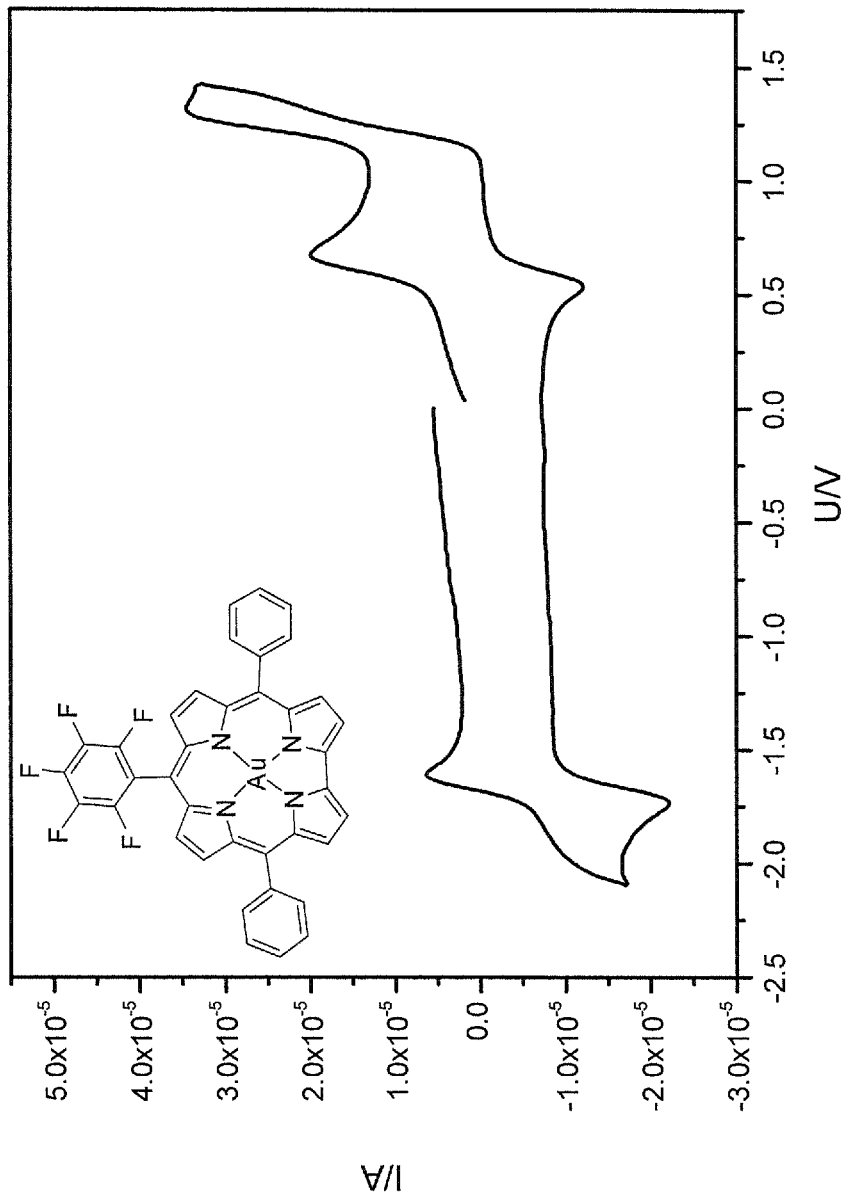
Figure 10: CV result of Material 503.

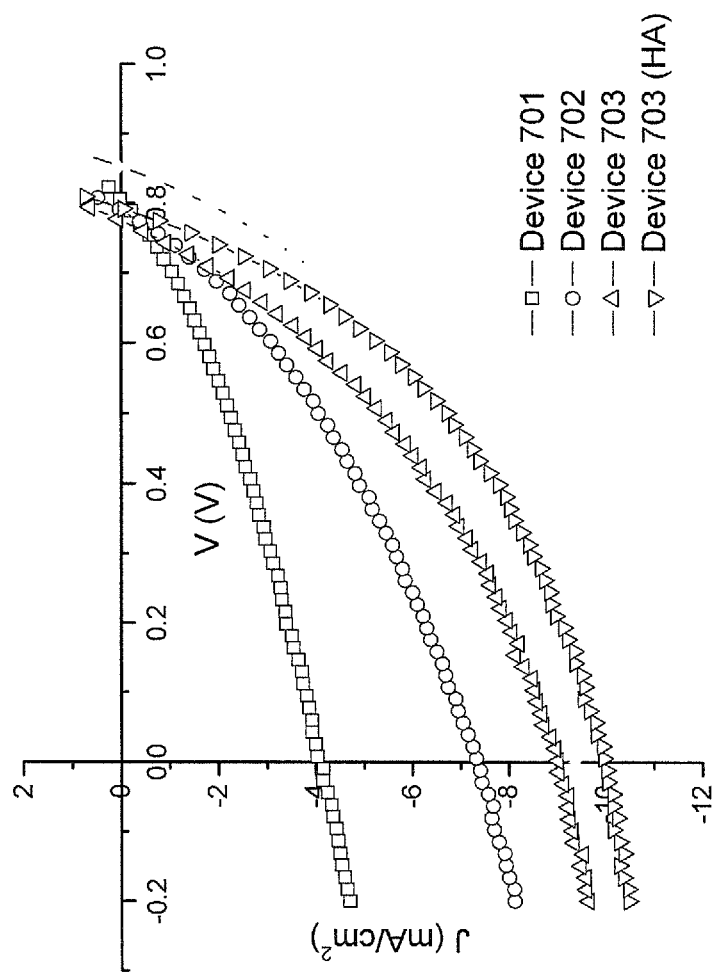
Figure 11: JV curve of Device 701 – 703.

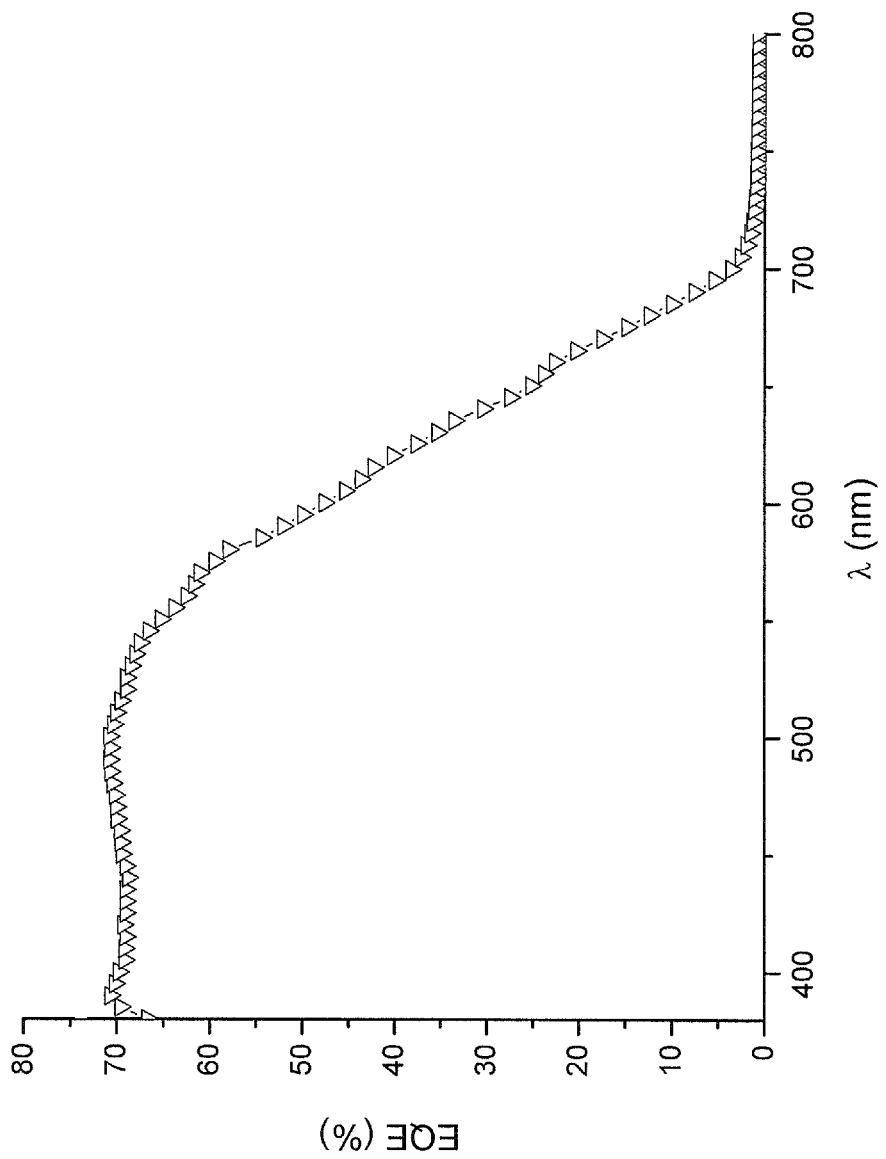
Figure 12: Efficiency curve of Device (HA).

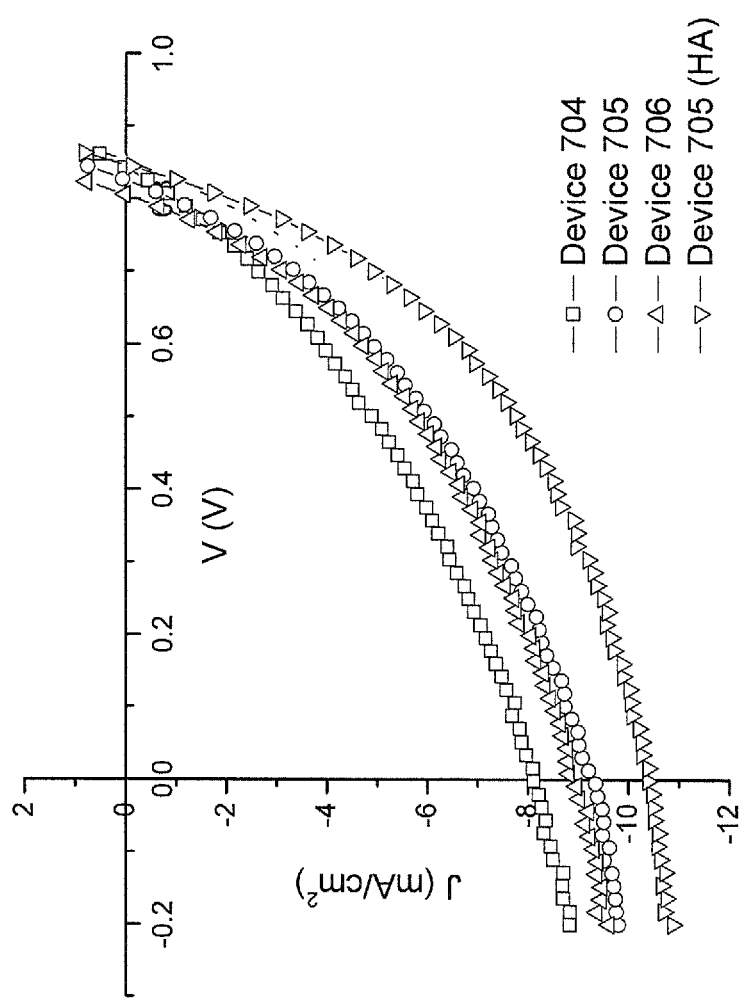
Figure 13: JV curves of Device 704 – Device 706.

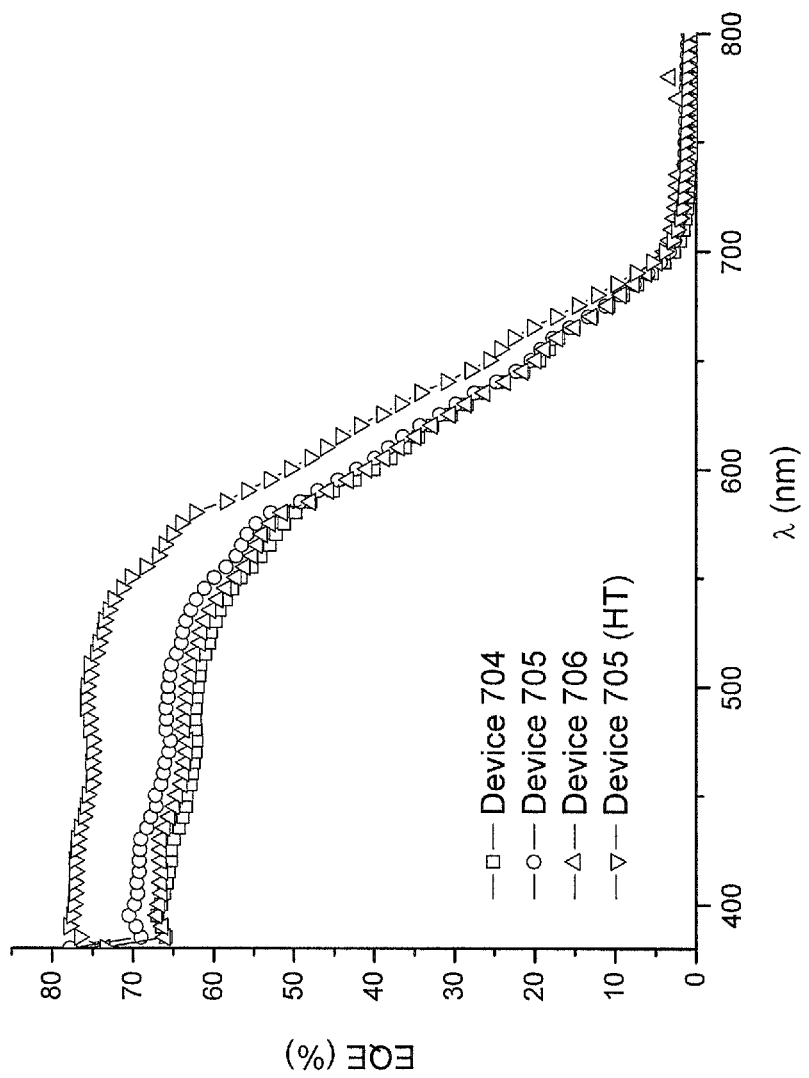
Figure 14: Efficiency curves of Device 704 – Device 706.

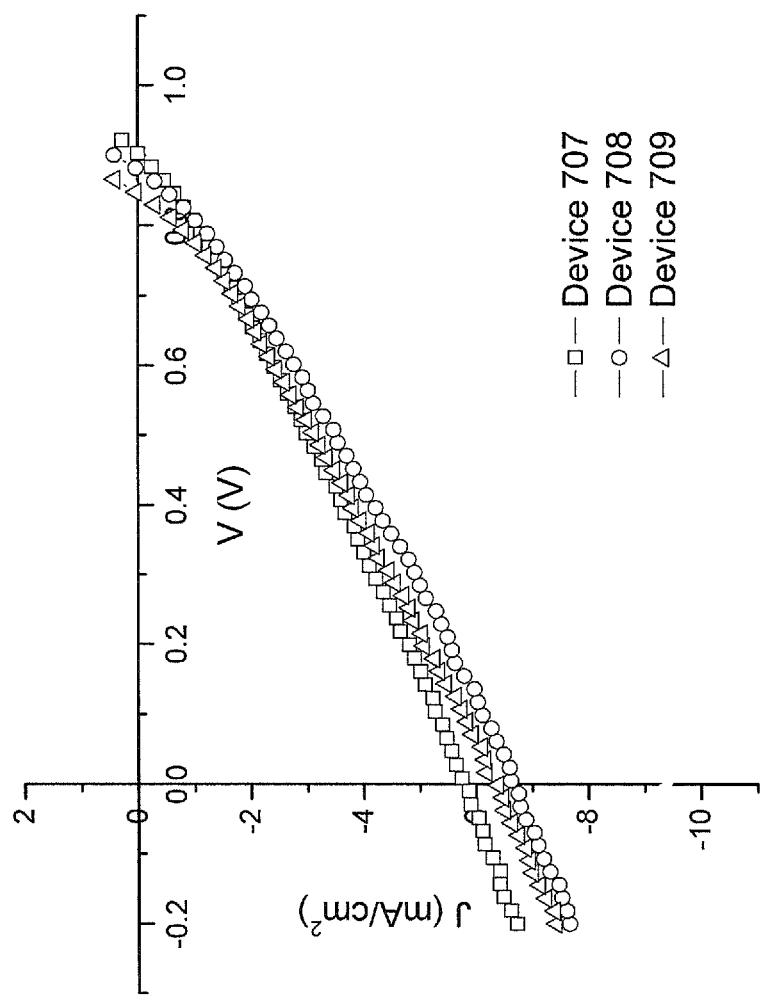
Figure 15: JV curves of Device 707 – Device 709.

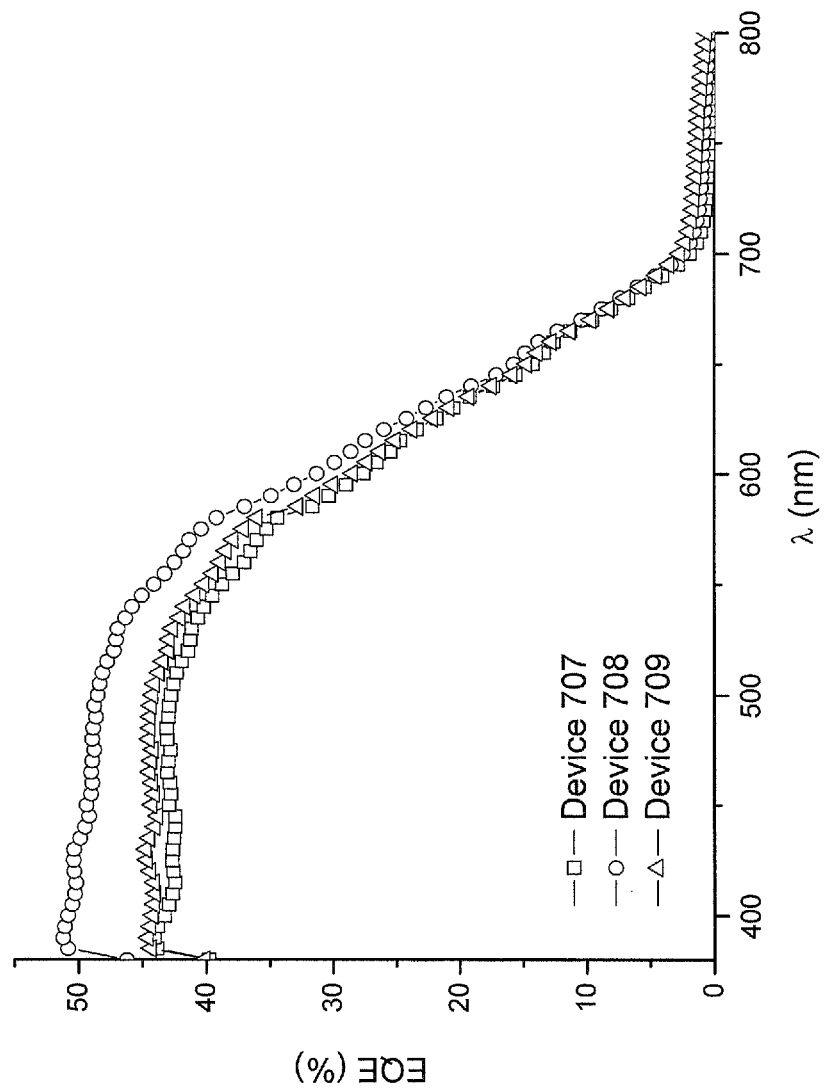
Figure 16: Efficiency curves of Device 707 – Device 709.

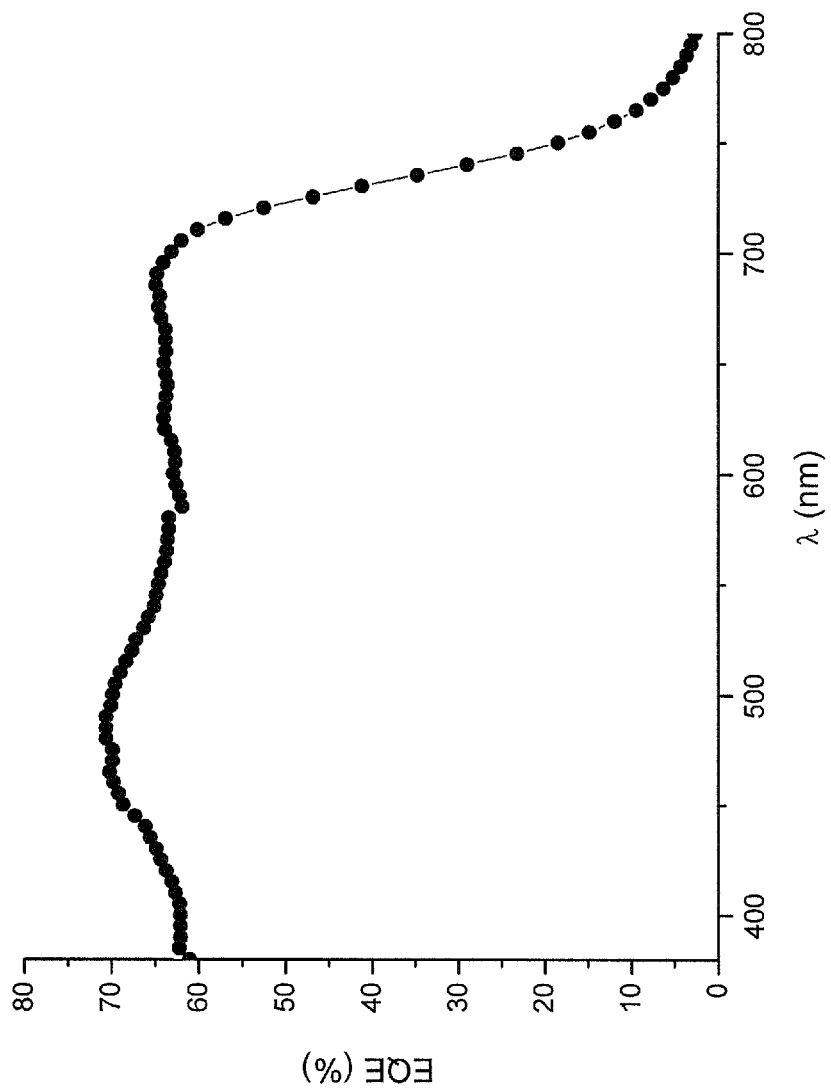
Figure 17: Efficiency curve of Device 710.

PHOTOVOLTAIC CONVERSION ELEMENT AND PHOTOVOLTAIC CELL

CROSS REFERENCE TO RELATED APPLICATIONS

This application claims priority to provisional application Ser. No. 61/884,461, filed on Sep. 30, 2013, which is incorporated herein by reference.

TECHNICAL FIELD

This invention relates organic photovoltaic (OPV) cell using gold complex as active material.

BACKGROUND

It is widely believed that fossil fuels will be consumed soon. On the other hand, the greenhouse gases such as carbon dioxides and methane generated from fossil fuel plants would lead global warming. Therefore, there are world-wide efforts to develop environmentally friendly energy and devices with low energy consumption and/or driven by renewable energy such as solar energy. Photovoltaic (PV) cell is one of the important devices to replace fossil fuel in electricity generation. To date, commercial available photovoltaic cells are made from inorganic semiconductors such as Si, CdTe, $CuIn_xGa_{1-x}Se$. Particularly, poly-silicon (poly-Si) and single crystal silicon (SC-Si) together contributed to nearly 90% of the market share. However, the high processing cost of inorganic semiconductors has posted a drawback in the development of solar cell industry.

In contrast, as organic photovoltaic (OPV) cells are of potential low cost, ease of process in large-scale production and compatibility on flexible substrates of organic semiconductors, many attractions have been drawn. OPV cell is an optoelectronic device comprises at least one component that utilize organic or organometallic small molecules or polymeric materials for light absorption and charge process. Harnessing the power of chemical synthesis, a large variety of organic molecules or polymers with different band gaps and absorption coefficients can be synthesized to maximize the light absorption and power generated from the photovoltaic cells. Thus, the organic photovoltaic cell has emerged as a new class of solar cell technologies.

Within the area of organic photovoltaic cells, various device architectures have been explored including the dye-sensitized solar cell (DSSC), organic/inorganic hybrid organic cells, and organic photovoltaic cells with heterojunctions. In 1986, C. W. Tang found that bilayer heterojunction structure fabricated from copper phthalocyanine (CuPc) and perylene tetracarboxylic derivative gives a power conversion efficiency (PCE) of 0.95%. Afterward, small-molecule donor materials such as pentacene, tetracene, metal phthalocyanines (Pcs) were widely studied.

Later, as polymeric materials show good device performance, most affords have been shifted to develop polymeric donor materials. Recently, the PCE of OPV with polymeric donor materials is approaching the practical value of 10%. Compare with the silicon-based solar cells, as the lower efficiency and shorter lifetime of the OPV can be compensated by their low cost at this value, OPV is ready for commercialization. (*Prog. Photovolt. Res, Appl.* 2012, 29, 377). In literature, PTB7 is one of the best polymeric donor materials. Using PTB7, a base value of 6.22% PCE has been obtained with a simple device fabrication method and architecture. (*Adv. Mater.* 2010, 22, E135) Using advanced device fabrication method, pro-treatment and different device architecture, the PCE of PTB7-OPV has been largely enhanced. (*Adv. Mater.* 2010, 22, E135; *Nature Photonics* 2012, 6, 591) The best value of 9.2% has been achieved by Prof. Cao Yong using an inverted structure. (*Nature Photonics* 2012, 6, 591)

On the other hand, it is widely accepted that, polymeric donors such as PTB7 suffer from 1) do not have well-defined molecular structures; 2) difficult to obtain high purity without batch-to-batch variation; 3) difficult to obtain material with high carrier mobility and 4) contain end groups as contaminants. These points have been summarized by Prof. Cao. (*Adv. Mater.* 2013, DOI:10:1002/adma.201301716) Therefore, the focus moved back to small-molecule donor materials. In 2011, Prof. Tang fabricated an OPV with small-molecule donor which gave a power conversion efficiency of 5.23%. (*Adv. Mater.* 2011, 23, 4960). In 2012, Prof. Nguyen developed a new small-molecule donor (p-DTS(FBTTh$_2$)$_2$). The device fabricated show a PCE of 1.8% without any post-treatment, and the best value of 5.8% was achieved after a 130° C. post-deposition annealing. (*Adv. Mater.* 2012, 24, 3646).

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Rather, the sole purpose of this summary is to present some concepts of the invention in a simplified form as a prelude to the more detailed description that is presented hereinafter.

In this invention, corrole type complexes are used as donor materials in OPV. Corrole type complexes are known useful for radionucluide labeling of vitamin $B_{12}$ and coenzyme (U.S. Pat. No. 5,739,313) since 1998. Cobalt corrole was used in this area. New corrole complexes were then developed with copper and silver as metal center. However, it is difficult to prepare corrole complexes with gold as metal center. Until 2011, gold corrole complexes were first reported by Abhik Ghosh. However, as the i) gold corrole complexes only show absorption in the regions where PCBM and PTB7 have strong absorption, ii) the phenyl rings in the triphenylcorrole are perpendicular to the corrole ring which prevent molecules to stack closely to get metal-metal or ligand-ligand interactions for obtain good charge mobility (*Chem. Eur. J.* 2011, 17, 12294), iii) corrole ring or gold corrole complexes are not good charge transporting groups, no good performance or enhancement is expected when they are used in OPV.

In current invention, we found that the OPVs fabricated with low concentration of gold corrole complexes have good PCE, which confirmed that the device with this configuration has good charge mobilities. This finding is contrary to the finding in literature. Besides, a low concentration of gold corrole complexes largely reduced the production cost of the OPV.

Described herein are organic photovoltaic (OPV) cells using gold complex(es) with as chemical structure of Structure I as active material:

Structure I

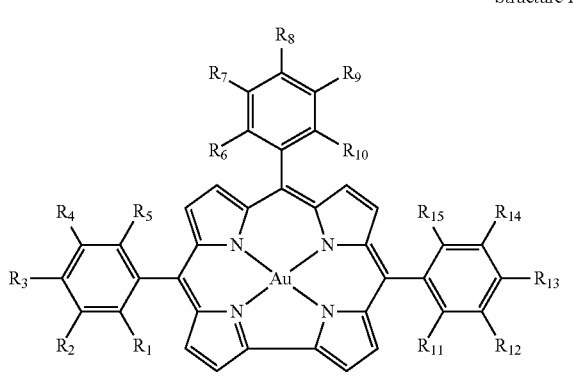

wherein, wherein $R_1$-$R_{15}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, alkylamino, nitro, acylamino, aralkyl, cyano, carboxyl, thio, styryl, aminocarbonyl, carbamoyl, aryloxycarbonyl, phenoxycarbonyl, hydroxyalkyl, or an alkoxycarbonyl group.

The OPV cell can be single layer, multi-layer, tandem structured and dispersed heterojunction OPV cell. The OPV cell can be fabricated by thermal deposition or solution process such as spin coat and printing.

BRIEF DESCRIPTION OF THE DRAWINGS

FIG. 1 depicts an embodiment of a synthetic scheme for the gold complexes with a chemical structure of Structure I.

FIG. 2 shows the UV spectrum of Material 501 $CH_2Cl_2$ solution.

FIG. 3 shows the UV spectrum of Material 502 $CH_2Cl_2$ solution.

FIG. 4 shows the UV spectrum of Material 503 $CH_2Cl_2$ solution.

FIG. 5 shows the TGA result of Material 501.
FIG. 6 shows the TGA result of Material 502.
FIG. 7 shows the TGA result of Material 503.
FIG. 8 shows the CV result of Material 501.
FIG. 9 shows the CV result of Material 502.
FIG. 10 shows the CV result of Material 503.
FIG. 11 shows the JV curves of Device 701-Device 703.
FIG. 12 shows the efficiency curve of Device 703 (HA).
FIG. 13 shows the JV curves of Device 704-Device 706.
FIG. 14 shows the efficiency curves of Device 704-Device 706.
FIG. 15 shows the JV curves of Device 707-709.
FIG. 16 shows the efficiency curves of Device 707-Device 709.
FIG. 17 shows the efficiency curve of Device 710.

DETAILED DESCRIPTION

Definitions

To facilitate the understanding of the subject matter disclosed herein, a number of terms, abbreviations or other shorthand as used herein are defined below. Any term, abbreviation or shorthand not defined is understood to have the ordinary meaning used by a skilled artisan contemporaneous with the submission of this application.

"Amino" refers to a primary, secondary, or tertiary amine which may be optionally substituted. Specifically included are secondary or tertiary amine nitrogen atoms which are members of a heterocyclic ring. Also specifically included, for example, are secondary or tertiary amino groups substituted by an acyl moiety. Some non-limiting examples of an amino group include —NR'R" wherein each of R' and R" is independently H, alkyl, aryl, aralkyl, alkaryl, cycloalkyl, acyl, heteroalkyl, heteroaryl or heterocycyl.

"Alkyl" refers to a fully saturated acyclic monovalent radical containing carbon and hydrogen, and which may be branched or a straight chain. Examples of alkyl groups include, but are not limited to, methyl, ethyl, n-propyl, isopropyl, n-butyl, t-butyl, n-heptyl, n-hexyl, n-octyl, and n-decyl.

"Alkylamino" means a radical —NHR or —$NR_2$ where each R is independently an alkyl group. Representative examples of alkylamino groups include, but are not limited to, methylamino, (1-methylethyl)amino, methylamino, dimethylamino, methylethylamino, and di(1-methyethyl)amino.

The term "hydroxyalkyl" means an alkyl radical as defined herein, substituted with one or more, preferably one, two or three hydroxy groups. Representative examples of hydroxyalkyl include, but are not limited to, hydroxymethyl, 2-hydroxyethyl, 2-hydroxypropyl, 3-hydroxypropyl, 1-(hydroxymethyl)-2-methylpropyl, 2-hydroxybutyl, 3-hydroxybutyl, 4-hydroxybutyl, 2,3-dihydroxypropyl, 2-hydroxy-1-hydroxymethylethyl, 2,3-dihydroxybutyl, 3,4-dihydroxybutyl and 2-(hydroxymethyl)-3-hydroxy-propyl, preferably 2-hydroxyethyl, 2,3-dihydroxypropyl, and 1-(hydroxymethyl)2-hydroxyethyl.

The term "alkoxy," as used herein, refers the radical —ORx. Exemplary alkoxy groups include, but are not limited to, methoxy, ethoxy, and propoxy.

"Aromatic" or "aromatic group" refers to aryl or heteroaryl.

"Aryl" refers to optionally substituted carbocyclic aromatic groups. In some embodiments, the aryl group includes phenyl, biphenyl, naphthyl, substituted phenyl, substituted biphenyl or substituted naphthyl. In other embodiments, the aryl group is phenyl or substituted phenyl.

"Aralkyl" refers to an alkyl group which is substituted with an aryl group. Some non-limiting examples of aralkyl include benzyl and phenethyl.

"Acyl" refers to a monovalent group of the formula —C(=O)H, —C(=O)-alkyl, —C(=O)-aryl, —C(=O)-aralkyl, or —C(=O)-alkaryl.

"Halogen" refers to fluorine, chlorine, bromine or iodine.

"Styryl" refers to a univalent radical C6H5-CH=CH— derived from styrene.

"Substituted" as used herein to describe a compound or chemical moiety refers to that at least one hydrogen atom of that compound or chemical moiety is replaced with a second chemical moiety. Non-limiting examples of substituents are those found in the exemplary compounds and embodiments disclosed herein, as well as halogen; alkyl; heteroalkyl; alkenyl; alkynyl; aryl, heteroaryl, hydroxy; alkoxyl; amino; nitro; thiol; thioether; imine; cyano; amido; phosphonato; phosphine; carboxyl; thiocarbonyl; sulfonyl; sulfonamide; ketone; aldehyde; ester; oxo; haloalkyl (e.g., trifluoromethyl); carbocyclic cycloalkyl, which can be monocyclic or fused or non-fused polycyclic (e.g., cyclopropyl, cyclobutyl, cyclopentyl or cyclohexyl) or a heterocycloalkyl, which can be monocyclic or fused or non-fused polycyclic (e.g., pyrrolidinyl, piperidinyl, piperazinyl, morpholinyl or thiazinyl); carbocyclic or heterocyclic, monocyclic or fused or non-fused polycyclic aryl (e.g., phenyl, naphthyl, pyrrolyl, indolyl, furanyl, thiophenyl, imidazolyl, oxazolyl, isoxazolyl, thiazolyl, triazolyl, tetrazolyl, pyrazolyl, pyridinyl, quinolinyl, isoquinolinyl, acridinyl, pyrazinyl, pyridazinyl, pyrimidinyl, benzimidazolyl, benzothiophenyl or benzofuranyl); amino (primary, secondary or tertiary); o-lower alkyl; o-aryl, aryl; aryl-lower alkyl; —CO2CH3; —CONH2; —OCH2CONH2; —NH2; —SO2NH2; —OCHF2; —CF3; —OCF3; —NH(alkyl); —N(alkyl)2; —NH(aryl); —N(alkyl)(aryl); —N(aryl)2; —CHO; —CO(alkyl); —CO(aryl); —CO2(alkyl); and —CO2(aryl); and such moieties can also be optionally substituted by a fused-ring structure or bridge, for example —OCH2O—. These substituents can optionally be further substituted with a substituent selected from such groups. All chemical groups disclosed herein can be substituted, unless it is specified otherwise. For example, "substituted" alkyl, alkenyl, alkynyl, aryl, hydrocarbyl or heterocyclo moieties described herein are moieties which are substituted with a hydrocarbyl moiety, a substituted hydrocarbyl moiety, a heteroatom, or a heterocyclo. Further, substituents may include moieties in which a carbon atom is substituted with a heteroatom such as nitrogen, oxygen, silicon, phosphorus, boron, sulfur, or a halogen atom. These substituents may include halogen, heterocyclo, alkoxy, alkenoxy, alkynoxy, aryloxy, hydroxy, protected hydroxy, keto, acyl, acyloxy, nitro, amino, amido, cyano, thiol, ketals, acetals, esters and ethers.

Various non-limiting embodiments are now described with reference to the accompanying drawings. These embodiments are presented only by way of example for implementing the invention and not by way of limitation.

In one aspect, the present invention provides OPV cells or devices using gold corrole organometallic compounds as light absorption component. The gold corrole organometallic compounds are typically provided in an active layer contained in the cell/device. In one embodiment, an organometallic complex is represented by Structure I. The gold center in Structure I is in the +3 oxidation state and has a square planar geometry. However, in some instances, the geometry can be better described substantially planar as the relatively small nature of the central hole in which the gold atom is positioned can be cramped, thereby slightly deforming the planar geometry. The coordination sites of the gold center are occupied by a corrole ligand. The corrole ligand featuring with 6-6-6-5 fused member rings coordinates to the gold center through one nitrogen donor bond and three deprotonated nitrogen metal bonds. The gold corrole compounds are electronically neutral.

The basic unsubstituted corrole ligand has nineteen carbon atoms, with four nitrogen atoms in the core of the molecule. A substituted corrole ligand typically has more than nineteen carbon atoms, with four nitrogen atoms in the core of the molecule. The corrole ligand is normally a trianionic ligand, and as a result, the corrole ligand supports the gold atom in the center in Structure I in the +3 oxidation state.

OPV with Gold Corrole Complexes

In one embodiment, the gold complexes with a chemical structure of Structure I:

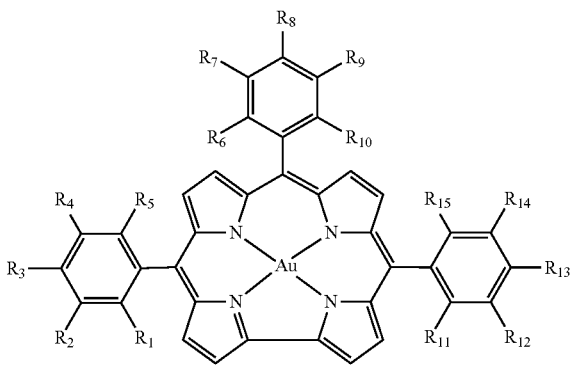

Structure I wherein, wherein $R_1$-$R_{15}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, alkylamino, nitro, acylamino, aralkyl, cyano, carboxyl, thio, styryl, aminocarbonyl, carbamoyl, aryloxycarbonyl, phenoxycarbonyl, hydroxyalkyl, or an alkoxycarbonyl group.

In one embodiment, each of $R_1$-$R_{15}$ is independently hydrogen, halogen (such as fluorine, chlorine bromine, or iodine), hydroxyl, an unsubstituted alkyl containing from 1 to 10 carbon atoms, a substituted alkyl containing from 1 to 20 carbon atoms, cycloalkyl containing from 4 to 20 carbon atoms, an unsubstituted aryl containing from 6 to 20 carbon atoms, a substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, aralkyl containing from 1 to 20 carbon atoms, cyano, carboxyl containing from 1 to 20 carbon atoms, thio, styryl, aminocarbonyl containing from 1 to 20 carbon atoms, carbamoyl containing from 1 to 20 carbon atoms, aryloxycarbonyl containing from 1 to 20 carbon atoms, phenoxycarbonyl containing from 1 to 20 carbon atoms, or an alkoxycarbonyl group containing from 1 to 20 carbon atoms. In another embodiment, each of $R_1$-$R_{15}$ is independently hydrogen, halogen (such as fluorine, chlorine bromine, or iodine), hydroxyl, an unsubstituted alkyl containing from 1 to 6 carbon atoms, a substituted alkyl containing from 1 to 6 carbon atoms, cycloalkyl containing from 6 to 12 carbon atoms, an unsubstituted aryl containing from 6 to 12 carbon atoms, a substituted aryl containing from 6 to 12 carbon atoms, acyl containing from 1 to 12 carbon atoms, alkoxy containing from 1 to 6 carbon atoms, acyloxy containing from 1 to 12 carbon atoms, amino, nitro, acylamino containing from 1 to 6 carbon atoms, aralkyl containing from 1 to 12 carbon atoms, cyano, carboxyl containing from 1 to 12 carbon atoms, thio, styryl, aminocarbonyl containing from 1 to 12 carbon atoms, carbamoyl containing from 1 to 12 carbon atoms, aryloxycarbonyl containing from 1 to 12 carbon atoms, phenoxycarbonyl containing from 1 to 12 carbon atoms, or an alkoxycarbonyl group containing from 1 to 12 carbon atoms.

In one embodiment, the total number of carbon atoms provided by the $R_1$-$R_{15}$ groups is 0. In another embodiment, the total number of carbon atoms provided by the $R_1$-$R_{15}$ groups is from 1 to 40. In yet another embodiment, the total number of carbon atoms provided by the $R_1$-$R_{15}$ groups is from 2 to 20. In one embodiment, in the gold corrole compound the $R_1$-$R_{15}$ groups are all hydrogen. In another embodiment, in the gold corrole compound the $R_1$-$R_{15}$ groups are all either hydrogen or halogen. In yet another embodiment, in the gold corrole compound the $R_1$-$R_{15}$ groups are all either hydrogen or alkyl groups.

Certain specific, non-limiting specific examples of the organometallic complexes with Structure I are shown as follows:

Material 501

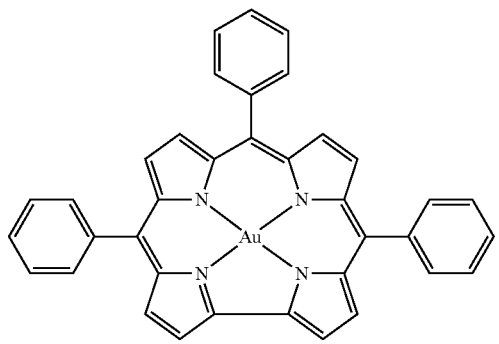

Material 502

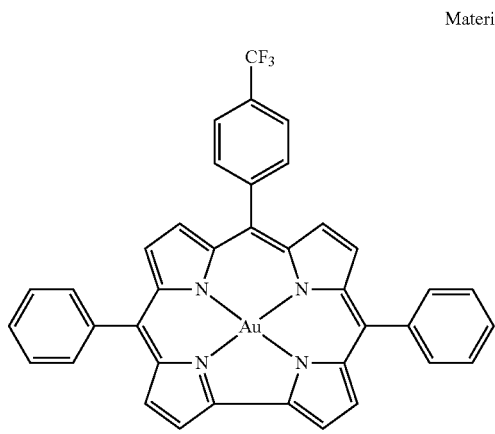

Material 503

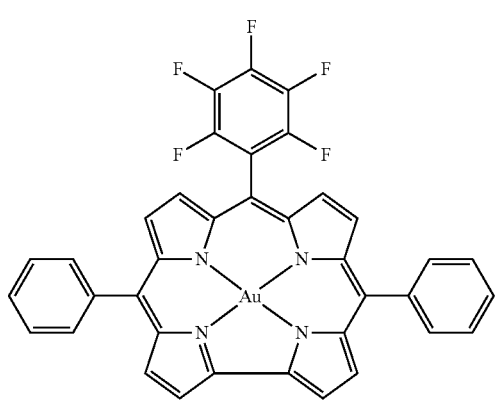

-continued

Material 504

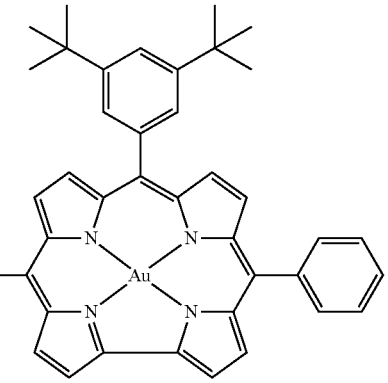

In one embodiment, the gold complexes with Structure I can be prepared by a series of reactions depicted in FIG. 1.

According to FIG. 1, pyrrole reacts with substituted or unsubstituted benzylaldehyde with different R groups through Reaction 401 to form Intermediate 100. Intermediate 100 is then reacted with the same or another substituted or unsubstituted benzylaldehyde with the same or different R groups through Reaction 402 to form Intermediate 200. Finally, Intermediate 200 was then converted to Material 500.

In one embodiment, Reaction 401 is stirring two reactants in the presence of an acid such as trifluoroacetic acid (TFA) or HCl in an inert atmosphere.

In one embodiment, Reaction 402 was stirring two reactants in the presence of an acid such as aqueous HCl using a suitable solvent such as an alcohol such as methanol followed by stirring the obtained product with p-Chloranil using a suitable organic solvent such as chloroform.

In one embodiment, Reaction 403 was reacting Intermediate 200 with a gold carboxylate using a suitable organic solvent such as pyridine. Gold carboxylates include gold acetate, gold ethylhexanoate, gold gluconate, gold propionates, and the like.

An OPV device contains an anode buffer layer, an active layer containing the gold corrole complex and an acceptor of fullerene C70, an optional exciton blocking layer, and a top cathode layer. The ratio of donor and acceptor in the blend of active layer was controlled by independently varying their deposition rates. In one embodiment, the active layer contains from 0.1% to 20% by weight of a gold corrole complex. In another embodiment, the active layer contains from 0.5% to 10% by weight of a gold corrole complex. In yet another embodiment, the active layer contains from 2% to 8% by weight of a gold corrole complex. The active layer can be made by vacuum deposition, vapor deposition, solution processing (spin coating, drip coating, spraying, etc.), and the like.

EXAMPLES

Following are examples that illustrate embodiments for practicing the invention. These examples should not be con-

Example 301

Preparation of Intermediate 101

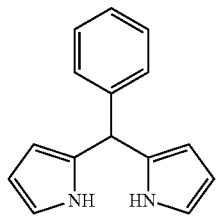 [SMILES: c1ccc(C(c2ccc[nH]2)c2ccc[nH]2)cc1]

A mixture of pyrrole (0.2 mol, 14 ml) and benzaldehyde (10 mmol, 1 ml) were added to a 100 ml dry round-bottomed flask and degassed with a stream of argon for 5 minutes. TFA (1 mmol, 0.08 ml) was then added. After about 1 hour 20 minutes, the solution was quenched with NaOH (0.1 M, 3 ml). The mixture was then extracted with ethyl acetate. The organic phase was washed with distilled water and dried by anhydrous $Na_2SO_4$. After solvent evaporation, the mixture was purified by column chromatography ($CH_2Cl_2$:Hexane=1:2). The first fraction was collected and evaporated to dryness and afforded a yellow solid (1.45 g, 66%). $^1$H-NMR (400 MHz, $CDCl_3$) . . . 5.46 (s, 1H), 5.94 (s, 2H), 6.18-6.20 (m, 2H), 6.68 (m, 2H), 7.23-7.37 (m, 5H), 7.87 (br s, 2H).

Example 302

Preparation of Intermediate 201

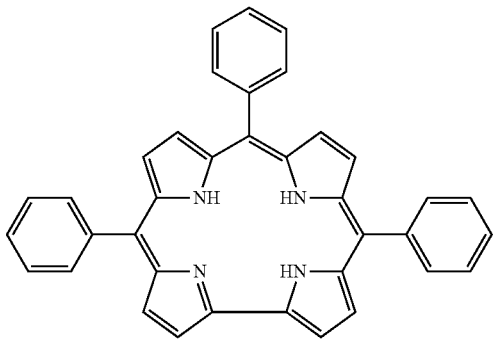 [SMILES: C1=Cc2nc1c(-c1ccccc1)c1ccc([nH]1)c(-c1ccccc1)c1ccc([nH]1)c(-c1ccccc1)c1ccc2[nH]1]

A mixture of Intermediate 101 (2 mmol, 444 mg) and benzylaldehyde (1 mmol, 0.1 ml) was dissolved in MeOH (75 mL) and $H_2O$ (75 mL) with $HCl_{aq}$ (36%, 5 mL) and stirred at room temperature for 1 h. $CHCl_3$ was used for extraction. The organic layer was washed twice with $H_2O$, and water was removed by dried $Na_2SO_4$. After filtration, the mixture was diluted with $CHCl_3$ to 250 mL. Then p-Chloranil (3 mmol, 738 mg) was added, and the mixture was stirred overnight at room temperature. After completion of the reaction, solvents were removed and the combined organic fractions were passed over a silica column ($CH_2Cl_2$), and all fractions containing corrole were combined and evaporated. Subsequent chromatography (silica, $CH_2Cl_2$:Hexane=1:1) afforded a green-violet product (100 mg, 20%). $^1$H-NMR (400 MHz, $CDCl_3$) . . . 8.96 (d, 2H), 8.89 (d, 4H), 8.59 (br, s, 4H), 8.37 (d, 4H), 8.18 (d, 2H), 7.82-7.74 (m, 9H).

Example 303

Preparation of Material 501

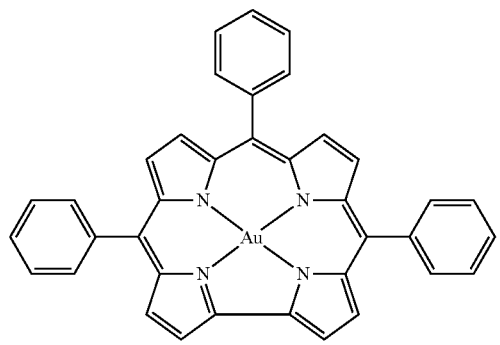

A mixture of Intermediate 201 (0.152 mmol, 80 mg) and 5 equiv. of gold(III) acetate (284 mg, 0.76 mmol) was dissolved in 8 mL of pyridine in a 100-mL round bottomed flask, and stirred overnight for 16 hours. After completion of the reaction, pyridine was removed by vacuum and column chromatography on silica gel with 4:1 n-hexane/$CH_2Cl_2$ gave the complex as the first red eluate (5 mg, 4%). $^1$H-NMR (400 MHz, $CDCl_3$) . . . 9.21 (d, 2H), 9.05 (d, 2H), 8.89 (d, 2H), 8.80 (d, 2H), 8.30 (d, 4H), 8.20 (d, 2H), 7.75-7.83 (m, 9H).

Example 304

Preparation of Intermediate 202

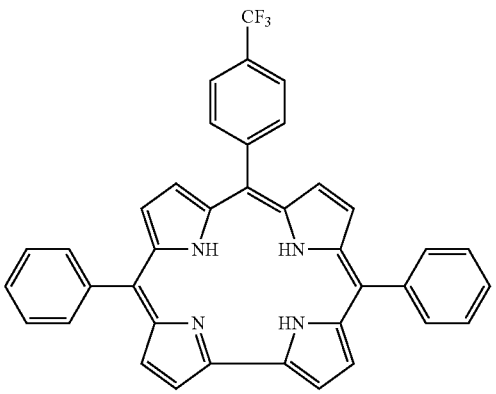 [SMILES: FC(F)(F)c1ccc(-c2c3ccc([nH]3)c(-c3ccccc3)c3nc(c4ccc([nH]4)c(-c4ccccc4)c4ccc2[nH]4)C=C3)cc1]

A mixture of intermediate 101 (2 mmol, 444 mg) and 4-(trifluoromethyl)benzaldehyde (1 mmol, 0.14 ml) was dissolved in MeOH (75 mL) and $H_2O$ (75 mL) with $HCl_{aq}$ (36%, 5 mL) and stirred at room temperature for 1 hour. $CHCl_3$ was used for extraction. The organic layer was washed twice with $H_2O$, and water was removed by dried $Na_2SO_4$. After filtration, the mixture was diluted with $CHCl_3$ to 250 mL. Then p-Chloranil (3 mmol, 738 mg) was added, and the mixture was stirred overnight at room temperature. After completion of the reaction, solvents were removed and the combined organic fractions were passed over a silica column ($CH_2Cl_2$), and all fractions containing corrole were combined and evaporated. Subsequent chromatography (silica, CH$_2$Cl$_2$:Hexane=1:1) afforded a green-violet product (180 mg, 29%). $^1$H-NMR (400 MHz, CDCl$_3$) . . . 8.98 (d, 2H), 8.90 (d, 2H), 8.60 (s, 2H), 8.53 (d, 2H), 8.37 (d, 4H), 8.30 (d, 2H), 8.01 (d, 2H), 7.87-7.81 (t, 4H), 7.74 (t, 2H).

Example 305

Preparation of Material 502

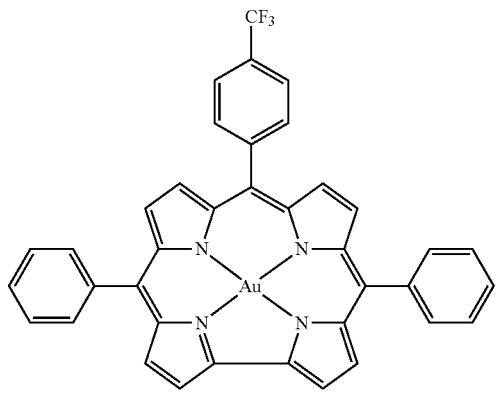

A mixture of Intermediate 202 (0.287 mmol, 170 mg) and gold(III) acetate (300 mg, 0.8 mmol) was dissolved in 8 mL of pyridine in a 100-mL round bottomed flask, and stirred overnight for 16 hours. After completion of the reaction, pyridine was removed by vacuum pump and column chromatography on silica gel with 8:1 n-hexane/CH$_2$Cl$_2$ gave the complex as the first red eluate (60 mg, 27%). $^1$H-NMR (400 MHz, CDCl3) . . . 9.22 (d, 2H), 9.07 (d, 2H), 8.90 (d, 2H), 8.75 (d, 2H), 8.33 (d, 6H), 8.05 (d, 2H), 7.75-7.84 (m, 6H).

Example 306

Preparation of Intermediate 203

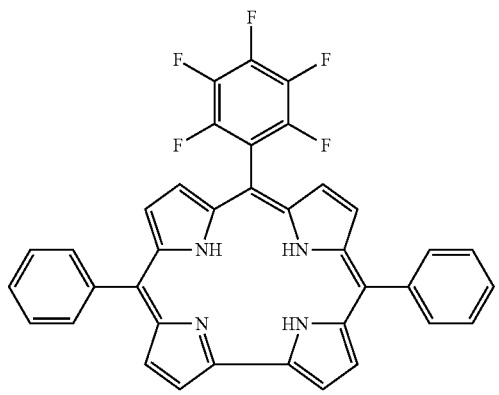 [SMILES: Fc1c(F)c(F)c(-c2c3ccc([nH]3)c(-c3ccccc3)c3nc(c4ccc([nH]4)c(-c4ccccc4)c4ccc2[nH]4)C=C3)c(F)c1F]

A mixture of Intermediate 101 (2 mmol, 444 mg) and 2,3,4,5,6-pentafluorobenzaldehyde (1 mmol, 0.124 ml) was dissolved in MeOH (75 mL) and water (75 mL) with HCl$_{aq}$ (36%, 5 mL) and stirred at room temperature for 1 hour. CHCl$_3$ was used for extraction. The organic layer was washed twice with distilled water, and water was removed by anhydrous Na$_2$SO$_4$. After filtration, the mixture was diluted with CHCl$_3$ to 250 mL. Then p-Chloranil (3 mmol, 738 mg) was added, and the mixture was stirred overnight at room temperature. After completion of the reaction, solvents were removed and the combined organic fractions were passed over a silica column (CH$_2$Cl$_2$), and all fractions containing corrole were combined and evaporated. Subsequent chromatography (silica, CH$_2$Cl$_2$:Hexane=1:1) afforded a green-violet product (154 mg, 25%). $^1$H-NMR (400 MHz, CDCl$_3$) . . . 8.90-8.82 (m, 2H), 8.72-8.65 (m, 4H), 8.40-8.32 (m, 4H), 8.23-8.07 (m, 2H), 7.80-7.75 (m, 6H).

Example 307

Preparation of Material 503

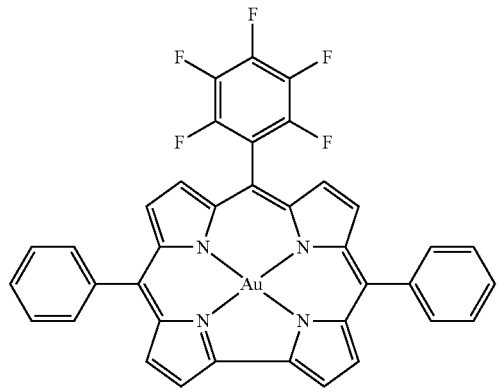

A mixture of Intermediate 203 (0.13 mmol, 80 mg) and gold(III) acetate (250 mg, 0.67 mmol) was dissolved in 8 mL of pyridine in a 100-mL round bottomed flask, and stirred overnight. After completion of the reaction, pyridine was removed by vacuum and column chromatography on silica gel with 8:1 n-hexane/CH$_2$Cl$_2$ gave the complex as the first red eluate (30 mg, 29%). $^1$H-NMR (400 MHz, CDCl$_3$) . . . 9.20 (d, 2H), 9.11 (d, 2H), 8.89 (d, 2H), 8.66 (d, 2H), 8.30 (d, 4H), 7.78-7.82 (m, 6H).

Example 308

Preparation of Intermediate 204

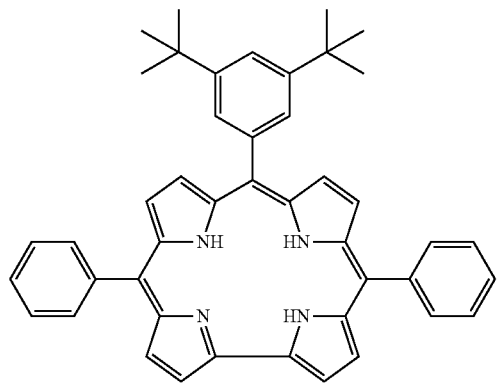 [SMILES: CC(C)(C)c1cc(-c2c3ccc([nH]3)c(-c3ccccc3)c3nc(c4ccc([nH]4)c(-c4ccccc4)c4ccc2[nH]4)C=C3)cc(C(C)(C)C)c1]

A mixture of Intermediate 101 (2 mmol, 444 mg) and ditert-butylaldehyde (1 mmol, 218 mg) was dissolved in MeOH (75 mL) and $H_2O$ (75 mL) with $HCl_{aq}$ (36%, 5 mL) and stirred at room temperature for 1 hour. $CHCl_3$ was used for extraction. The organic layer was washed twice with $H_2O$, and water was removed by dried $Na_2SO_4$. After filtration, the mixture was diluted with $CHCl_3$ to 250 mL. Then p-Chloranil (3 mmol, 738 mg) was added, and the mixture was stirred overnight at room temperature. After completion of the reaction, solvents were removed and the combined organic fractions were passed over a silica column ($CH_2Cl_2$), and all fractions containing corrole were combined and evaporated. Subsequent chromatography (silica, $CH_2Cl_2$:Hexane=1:1) afforded a green-violet product (110 mg, 20%).

Example 309

Preparation of Material 504

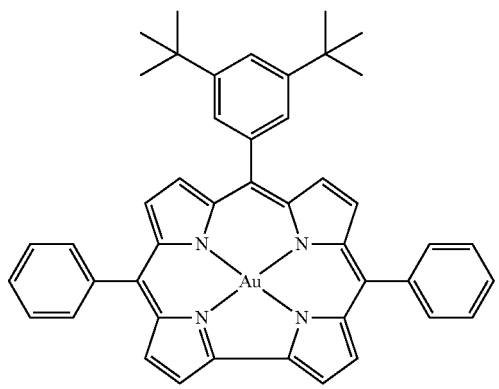

A mixture of ditert-butyl (80 mg) and 5 equiv of gold(III) acetate was dissolved in 8 mL of pyridine in a 100-mL round bottomed flask, and stirred overnight. After completion of the reaction, pyridine was removed by vacuum and column chromatography on silica gel with 4:1 n-hexane/$CH_2Cl_2$ gave the complex as the first red eluate (5 mg).

Example 310

Physical Properties of Material 501-Material 504

Below data are extracted from FIGS. 2-10

| Material | Absorption $\lambda_{max}$/nm ($\lambda$, ×$10^4$ $cm^{-1}M^{-1}$) | $T_d^1$/° C. | HOMO/ eV | LUMO/ eV |
|---|---|---|---|---|
| 1 | 279 (6.68); 418 (12.48); 559 (2.55); 574 (3.10) | 432 | −5.12 | −3.20 |
| 2 | 256 (3.11); 420 (16.55); 559 (3.36); 573 (4.07) | 404 | −5.22 | −3.16 |
| 3 | 281 (2.61); 418 (19.09); 556 (3.13); 565 (3.15) | 400 | −5.30 | −3.23 |

[1]$T_d$: decomposition temperature.

Example 311

General Preparation Procedures for Thermal Deposition OPV

Device was grown on glass substrates pre-coated with indium-tin-oxide (ITO) anode with sheet resistance of 15 ohm/square. It was sequentially cleaned with organic solvents, Decon 90 detergent, rinsed in de-ionized water, and dried in an oven before loading into an evaporation chamber for successive film deposition. Organic and metal layers were successively deposited at a rate of 0.1-0.2 nm/s in a Trovato Mfg., Inc. high vacuum evaporator under a base pressure of <10 Torr without vacuum break. Film thicknesses were determined in-situ by calibrated oscillating quartz-crystal sensors. Shadow masks were used to define the organic layers and the cathode to make four 0.1 $cm^2$ devices on each substrate. OPV consist of an anode buffer layer of $MoO_x$ light absorption material, an acceptor of fullerene $C_{70}$, an exciton blocking layer of bathophenanthroline (BPhen), and a top cathode layer of aluminum. The ratio of donor and acceptor in the blend of active layer was controlled by independently varying their deposition rates. Except for material 1 and material 2, all materials were used as received without further purification. An ORIEL Xe lamp with an AM1.5 global filter was used to provide an illumination with an incident power of 100 mW/$cm^2$ for OPV. The illumination intensity was calibrated by an ORIEL crystal silicon reference diode. Current density-voltage characteristics were measured with a programmable Keithley model 2400 source-meter measurement unit. External quantum efficiency spectra were measured by an integrated system with a Xe lamp, an optical chopper, a monochromator, and amplifiers. All experiments and measurements were carried out at room temperature under ambient environment without device encapsulation.

Example 312

Preparation procedure of Device 701

A device fabricated with Example 311 wherein the light absorption material is Material 501. The device structure of Device 701 is: ITO/$MoO_x$/3% Material 501: $C_{70}$/BPhen/Al Example 313

Preparation Procedure of Device 702

A device fabricated with Example 311 wherein the light absorption material is Material 501. The device structure of Device 702 is: ITO/$MoO_x$/5% Material 501: $C_{70}$/BPhen/Al Example 314

Preparation procedure of Device 703

A device fabricated with Example 311 wherein the light absorption material is Material 501. The device structure of Device 703 is: ITO/$MoO_x$/7% Material 501: $C_{70}$/BPhen/Al Example 315

Preparation Procedure of Device 704

A device fabricated with Example 311 wherein the light absorption material is Material 502. The device structure of Device 704 is: ITO/$MoO_x$/3% Material 502: $C_{70}$/BPhen/Al Example 316

Preparation Procedure of Device 705

A device fabricated with Example 311 wherein the light absorption material is Material 502. The device structure of Device 705 is: ITO/$MoO_x$/5% Material 502: $C_{70}$/BPhen/Al

Example 317

Preparation Procedure of Device 706

A device fabricated with Example 311 wherein the light absorption material is Material 502. The device structure of Device 706 is: ITO/MoO$_x$/7% Material 502: C$_{70}$/BPhen/Al

Example 318

Preparation Procedure of Device 707

A device fabricated with Example 311 wherein the light absorption material is Material 503. The device structure of Device 707 is: ITO/MoO$_x$/3% Material 503: C$_{70}$/BPhen/Al

Example 318

Preparation Procedure of Device 708

A device fabricated with Example 311 wherein the light absorption material is Material 503. The device structure of Device 708 is: ITO/MoO$_x$/5% Material 503: C$_{70}$/BPhen/Al

Example 319

Preparation Procedure of Device 709

A device fabricated with Example 311 wherein the light absorption material is Material 503. The device structure of Device 709 is: ITO/MoO$_x$/7% Material 503: C$_{70}$/BPhen/Al

Example 320

Preparation Procedures for Solution Processed OPV—Device 710

Devices were grown on glass substrates pre-coated with an anode of indium-tin-oxide (ITO) with sheet resistance of 15 ohm/square. They were cleaned with organic solvents, Decon 90 detergent, rinsed in de-ionized water, dried in an oven, and treated in ultraviolet ozone chamber prior to successive film deposition. A ca. 30 nm anode buffer layer of poly(3,4-ethylenedioxythiophene):polystyrenesulfonate (PEDOT:PSS) was spin-coated onto ITO surface and annealed in atmosphere circumstance. A blend of active layer material 2: thieno[3,4-b]-thiophene/benzodithiophene (PTB7):fullerene (PC$_{70}$BM), with a thickness of ca. 80 nm, was then cast on PEDOT:PSS from a solution in chlorobenzene with 3% 1,8-diiodooctane mixed solvent. The devices were immediately loaded into an evaporator where a top composite cathode layer of both calcium and aluminum was deposited. An ORIEL Xe lamp with an AM1.5 global filter was used to provide an illumination with an incident power of 100 mW/cm$^2$ for OPV. The illumination intensity was calibrated by an ORIEL crystal silicon reference diode. Current density-voltage characteristics were measured with a programmable Keithley model 2400 source-meter measurement unit. External quantum efficiency spectra were measured by an integrated system with a Xe lamp, an optical chopper, a monochromator, and amplifiers. All experiments and measurements were carried out at room temperature under ambient environment without device encapsulation.

Example 321

Performance of Device 701-Device 710

Below data are extracted from FIGS. 11-13

| Device | $V_{oc}$/V | $I_{sc}$/mAcm$^2$ | FF | PCE/% |
|---|---|---|---|---|
| 701 | 0.80 | 4.09 | 0.34 | 1.11 |
| 702 | 0.79 | 7.32 | 0.35 | 2.02 |
| 703 | 0.77 | 8.97 | 0.39 | 2.69 |
| 703 (HA) | 0.79 | 9.92 | 0.43 | 3.37 |
| 704 | 0.84 | 8.11 | 0.36 | 2.5 |
| 705 | 0.82 | 9.21 | 0.40 | 3.0 |
| 705 (HA) | 0.85 | 10.34 | 0.46 | 4.0 |
| 706 | 0.80 | 8.92 | 0.41 | 2.9 |
| 707 | 0.90 | 5.79 | 0.29 | 1.5 |
| 708 | 0.88 | 6.67 | 0.30 | 1.7 |
| 709 | 0.84 | 6.34 | 0.29 | 1.6 |
| 710 | 0.74 | 17.7 | 0.45 | 5.9 |

HA: heat annealing

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about"

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An organic photovoltaic device comprising at least one light absorption material with a chemical structure of Structure I:

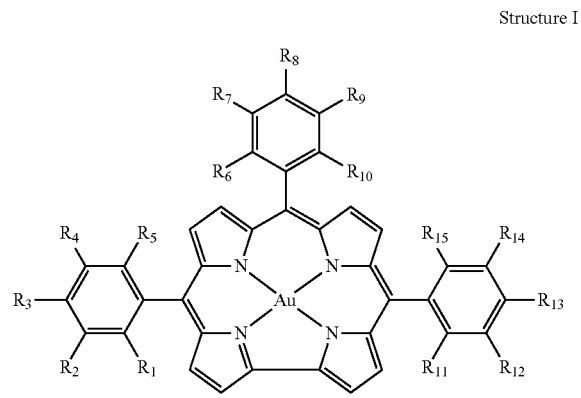

Structure I wherein, wherein R$_1$-R$_{15}$ are independently hydrogen, halogen, hydroxyl, an unsubstituted alkyl, a substituted alkyl, cycloalkyl, an unsubstituted aryl, a substituted aryl, acyl, alkoxy, acyloxy, amino, nitro, acylamino, aralkyl, cyano, carboxyl, thiol, styryl, aminocarbonyl, carbamoyl, aryloxycarbonyl, or an alkoxycarbonyl group.

2. The organic photovoltaic device in claim 1 wherein the light absorption material materials are selected from the group consisting of:

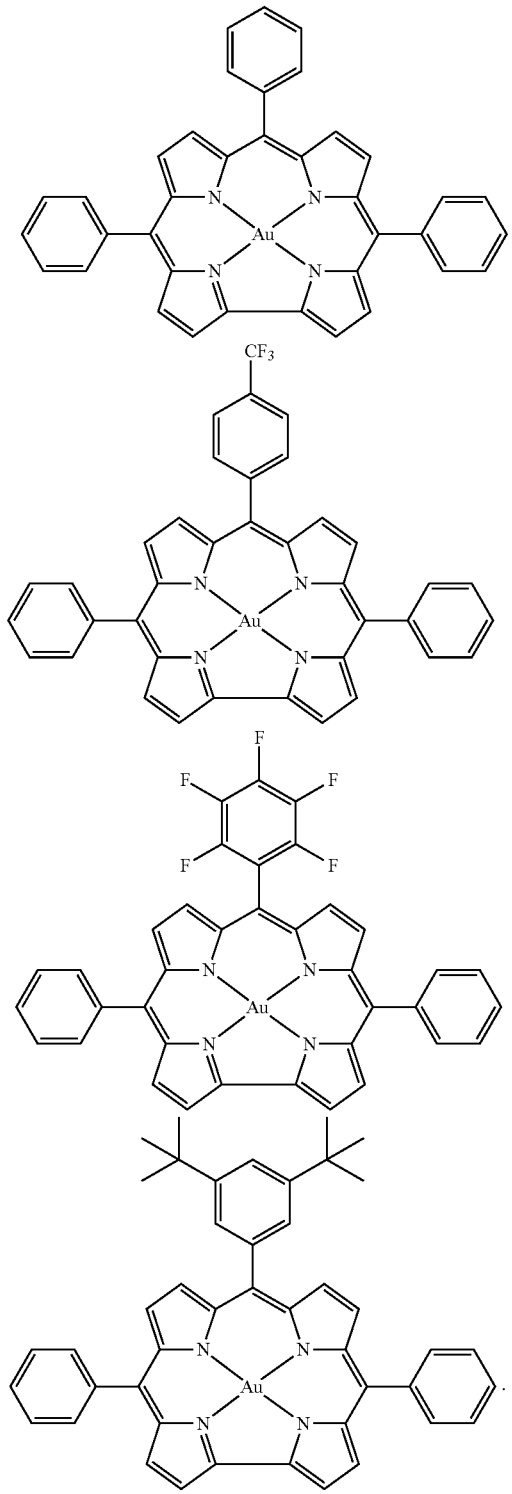

3. The organic photovoltaic device in claim 1, wherein an active layer of the organic photovoltaic device contains less than 10% light absorption material with a chemical structure of Structure I.

4. The organic photovoltaic device in claim 1, wherein the device structure comprises an ITO layer, a $MoO_x$ layer, an active layer comprising the light absorption material with a chemical structure of Structure I and $C_{70}$/BPhen/Al.

5. The organic photovoltaic device in claim 1, wherein the device structure is: ITO/PEDOT:PPS/Active layer contains material with a chemical structure of Structure I/Ca/Al.

6. The organic photovoltaic device in claim 1, wherein each of $R_1$-$R_{15}$ is independently hydrogen, hydroxyl, an unsubstituted alkyl containing from 1 to 10 carbon atoms, a substituted alkyl containing from 1 to 20 carbon atoms, cycloalkyl containing from 4 to 20 carbon atoms, an unsubstituted aryl containing from 6 to 20 carbon atoms, a substituted aryl containing from 6 to 20 carbon atoms, acyl containing from 1 to 20 carbon atoms, alkoxy containing from 1 to 20 carbon atoms, acyloxy containing from 1 to 20 carbon atoms, amino, nitro, acylamino containing from 1 to 20 carbon atoms, cyano, carboxyl containing from 1 to 20 carbon atoms, thiol, styryl, aminocarbonyl containing from 1 to 20 carbon atoms, or carbamoyl containing from 1 to 20 carbon atoms.

7. The organic photovoltaic device in claim 1, wherein each of $R_1$-$R_{15}$ is independently hydrogen, hydroxyl, an unsubstituted alkyl containing from 1 to 6 carbon atoms, a substituted alkyl containing from 1 to 6 carbon atoms, cycloalkyl containing from 6 to 12 carbon atoms, an unsubstituted aryl containing from 6 to 12 carbon atoms, a substituted aryl containing from 6 to 12 carbon atoms, acyl containing from 1 to 12 carbon atoms, alkoxy containing from 1 to 6 carbon atoms, acyloxy containing from 1 to 12 carbon atoms, amino, nitro, acylamino containing from 1 to 6 carbon atoms, cyano, carboxyl containing from 1 to 12 carbon atoms, thiol, styryl, aminocarbonyl containing from 1 to 12 carbon atoms, or carbamoyl containing from 1 to 12 carbon atoms.

8. The organic photovoltaic device in claim 1, wherein at least one of $R_1$-$R_{15}$ is fluorine, chlorine, bromine, or iodine.

9. The organic photovoltaic device in claim 1, wherein the total number of carbon atoms provided by the $R_1$-$R_{15}$ groups is 0.

10. The organic photovoltaic device in claim 1, wherein the total number of carbon atoms provided by the $R_1$-$R_{15}$ groups is from 1 to 40.

11. The organic photovoltaic device in claim 1, wherein the total number of carbon atoms provided by the $R_1$-$R_{15}$ groups is from 2 to 20.

12. The organic photovoltaic device in claim 1, wherein $R_1$-$R_{15}$ groups are all hydrogen.

13. The organic photovoltaic device in claim 1, wherein the $R_1$-$R_{15}$ groups are all either hydrogen or halogen.

14. The organic photovoltaic device in claim 1, wherein the $R_1$-$R_{15}$ groups are all either hydrogen, substituted alkyl groups, or unsubstituted alkyl groups.

* * * * *